United States Patent
Han et al.

(10) Patent No.: US 12,125,428 B2
(45) Date of Patent: Oct. 22, 2024

(54) SHIFT REGISTER AND DRIVING METHOD THEREOF, LIGHT EMISSION CONTROL DRIVER AND DISPLAY APPARATUS

(71) Applicant: BOE Technology Group Co., Ltd., Beijing (CN)

(72) Inventors: Seungwoo Han, Beijing (CN); Haoliang Zheng, Beijing (CN); Dongni Liu, Beijing (CN); Li Xiao, Beijing (CN); Jiao Zhao, Beijing (CN); Xiaorong Cui, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/923,690

(22) PCT Filed: Nov. 29, 2021

(86) PCT No.: PCT/CN2021/133900
§ 371 (c)(1),
(2) Date: Nov. 7, 2022

(87) PCT Pub. No.: WO2023/092538
PCT Pub. Date: Jun. 1, 2023

(65) Prior Publication Data
US 2024/0221608 A1    Jul. 4, 2024

(51) Int. Cl.
*G09G 3/32* (2016.01)
*G11C 19/28* (2006.01)

(52) U.S. Cl.
CPC .............. *G09G 3/32* (2013.01); *G11C 19/28* (2013.01); *G09G 2300/0842* (2013.01);
(Continued)

(58) Field of Classification Search
CPC .............. G09G 3/32; G09G 2300/0842; G09G 2300/0861; G09G 2310/0286; G09G 2310/08
See application file for complete search history.

(56) References Cited

U.S. PATENT DOCUMENTS 9,548,026 B2    1/2017  Jang
2017/0301295 A1  10/2017  Park et al.
(Continued)

FOREIGN PATENT DOCUMENTS

CN    106887209 A    6/2017
CN    104318904 B    8/2017
(Continued)

*Primary Examiner* — Dennis P Joseph
(74) *Attorney, Agent, or Firm* — Nath, Goldberg & Meyer; Joshua B. Goldberg

(57) ABSTRACT

A shift register includes: an input circuit configured to receive an input signal; a first control circuit configured to control, in response to a second clock signal and a voltage at a second node, a voltage at the first node; a second control circuit configured to control, in response to a first clock signal, the second clock signal, and the voltage at the first node, a voltage at the second node, and control, in response to the second clock signal and the voltage at the first node, a voltage at the fifth node; and an output circuit configured to transmit, in response to an active level at the first node, a second power signal to an output signal terminal, and transmit, in response to an active level at the fifth node, the first power signal to the output signal terminal. All transistors included in the shift register are N-type transistors.

20 Claims, 12 Drawing Sheets

(52) U.S. Cl.
CPC ............... *G09G 2300/0861* (2013.01); *G09G 2310/0286* (2013.01); *G09G 2310/08* (2013.01)

(56) References Cited

U.S. PATENT DOCUMENTS

| | | | |
|---|---|---|---|
| 2021/0166603 A1* | 6/2021 | Feng | ................... G11C 19/28 |
| 2022/0013078 A1* | 1/2022 | Kim | ................... G09G 3/3688 |
| 2023/0169917 A1* | 6/2023 | Xiao | ................... G09G 3/3266 |
| | | | 345/204 |

FOREIGN PATENT DOCUMENTS

| | | |
|---|---|---|
| CN | 108198586 A | 6/2018 |
| CN | 111583880 A | 8/2020 |
| CN | 113066422 A | 7/2021 |
| CN | 113284459 A | 8/2021 |
| CN | 113625893 A | 11/2021 |
| JP | 2015138916 A | 7/2015 |

\* cited by examiner

SHIFT REGISTER AND DRIVING METHOD THEREOF, LIGHT EMISSION CONTROL DRIVER AND DISPLAY APPARATUS

This is a National Phase Application filed under 35 U.S.C. 371 as a national stage of PCT/CN2021/133900, filed Nov. 29, 2021, the contents of which are hereby incorporated by reference in its entirety.

TECHNICAL FIELD

The present application relates to the field of display technology, and specifically relates to a shift register and a driving method thereof, a light emission control driver for a display apparatus, and a display apparatus.

BACKGROUND

In a display panel using a self-luminous device such as a light-emitting diode (LED), the light-emitting efficiency of the self-luminous device will decrease with the decrease of the current density, and when the current flowing through the self-luminous device reaches a certain magnitude or less, non-uniform luminance occurs, which may affect the display effect of the display panel at low grayscales. Therefore, a pulse width modulation (PWM) signal is used to control the light emission time to implement display at low grayscales.

As the size of display panels increases, the types and manufacturing processes of thin film transistors commonly used in small-sized display panels may be no longer applicable, and other types of thin film transistors are desired. However, the light emission control driver including other types of thin film transistors and the shift register circuits employed therein in the related art have certain drawbacks.

SUMMARY

In one aspect, the present disclosure provides a shift register, including: an input circuit connected to an input signal terminal, a first clock terminal, and a first node, and configured to receive an input signal applied to the input signal terminal and transmit, in response to a first clock signal applied to the first clock terminal, the input signal to the first node; a first control circuit connected to a second clock terminal, a first power terminal, the first node, and a second node, and configured to receive a first power signal applied to the first power terminal and control, in response to a second clock signal applied to the second clock terminal and a voltage at the second node, a voltage at the first node; a second control circuit connected to the first clock terminal, the second clock terminal, the first power terminal, a second power terminal, the first node, the second node, and a fifth node, and configured to receive the first power signal and a second power signal applied to the second power terminal, control, in response to a first clock signal, the second clock signal, and the voltage at the first node, a voltage at the second node, and control, in response to the second clock signal and the voltage at the first node, a voltage at the fifth node; and an output circuit connected to the first node, the fifth node, the first power terminal, the second power terminal, and an output signal terminal, and configured to transmit, in response to an active level at the first node, the second power signal to the output signal terminal, and transmit, in response to an active level at the fifth node, the first power signal to the output signal terminal. Duration of a time period in which an output signal output from the output signal terminal has an inactive level depends on duration of a time period in which the input signal applied to the input signal terminal has an inactive level. All transistors included in the shift register are N-type transistors.

In some embodiments, in response to the input signal having an inactive level and the first clock signal changing from an inactive level to an active level, the voltage at the first node changes from a second level to a first level, and in response to the input signal having an active level and the second clock signal changing from an inactive level to an active level, the voltage at the first node changes from the second level to a third level, where the first level is an inactive level, the second level and the third level are active levels, and the first level is lower than the second level, while the second level is lower than the third level.

In some embodiments, in response to the input signal having an inactive level and the second clock signal changing from an inactive level to an active level, the voltage at the second node changes from a fifth level to a sixth level, and in response to the input signal having an active level and the first clock signal changing from an active level to an inactive level, the voltage at the second node changes from the fifth level to a fourth level, where the fourth level is an inactive level, the fifth level and the sixth level are active levels, and the fourth level is lower than the fifth level, while the fifth level is lower than the sixth level.

In some embodiments, the first control circuit includes: a first control transistor, a second control transistor and a first control capacitor. The first control transistor has a control electrode connected to the second clock terminal, a first electrode connected to the first node, and a second electrode connected to a third node. The second control transistor has a control electrode connected to the second node, a first electrode connected to the third node, a second electrode connected to the first power terminal. The first control capacitor has a first terminal connected to the second clock terminal, and a second terminal connected to the first node.

In some embodiments, the second control circuit includes: a third control transistor, a fourth control transistor, a fifth control transistor, a sixth control transistor and a second control capacitor. The third control transistor has a control electrode connected to the first node, a first electrode connected to the first clock terminal, and a second electrode connected to the second node. The fourth control transistor has a control electrode connected to the first clock terminal, a first electrode connected to the second power terminal, and a second electrode connected to the second node. The fifth control transistor has a control electrode connected to the second node, a first electrode connected to the second clock terminal, and a second electrode connected to a fourth node. The sixth control transistor has a control electrode connected to the second clock terminal, a first electrode connected to the fourth node, and a second electrode connected to the fifth node. The second control capacitor has a first terminal connected to the second node, and a second terminal connected to the fourth node.

In some embodiments, the second control circuit further includes: a seventh control transistor and a third control capacitor. The seventh control transistor has a control electrode connected to the first node, a first electrode connected to the fifth node, and a second electrode connected to the first power terminal. The third control capacitor has a first terminal connected to the fifth node, and a second terminal connected to the first power terminal.

In some embodiments, the output circuit includes: a first output transistor and a second output transistor. The first output transistor has a control electrode connected to the first node, a first electrode connected to the second power terminal, and a second electrode connected to the output signal terminal. The second output transistor has a control electrode connected to the fifth node, a first electrode connected to the output signal terminal, and a second electrode connected to the first power terminal.

In some embodiments, the input circuit includes: a first input transistor having a control electrode connected to the first clock terminal, a first electrode connected to the input signal terminal, and a second electrode connected to the first node.

In some embodiments, all transistors included in the shift register are oxide thin film transistors.

In another aspect, the present disclosure provides a light emission control driver, including multiple stages of shift registers, each shift register being the shift register described above.

In some embodiments, the first clock terminal of a shift register at an odd-numbered stage in the multiple stages of shift registers is connected to a first clock signal line, while the second clock terminal of the shift register at an odd-numbered stage is connected to a second clock signal line. The first clock terminal of a shift register at an even-numbered stage in the multiple stages of shift registers is connected to the second clock signal line, while the second clock terminal of the shift register at an even-numbered stage is connected to the first clock signal line. A clock signal applied to the first clock signal line and a clock signal applied to the second clock signal line have a same frequency and phases different from each other by 180°.

In some embodiments, an emission start signal is applied to the input signal terminal of a shift register at a first stage in the multiple stages of shift registers, and the input signal terminal of a shift register at each stage except for the first stage in the multiple stages of shift registers is connected to the output signal terminal of a shift register at a previous stage.

In another aspect, the present disclosure provides a display apparatus, including: a plurality of pixels each connected to a corresponding one of a plurality of gate lines, a corresponding one of a plurality of data lines, and a corresponding one of a plurality of light emission control lines; and the light emission control driver described above, where the output signal terminal of a shift register at each stage in the light emission control driver is connected to a corresponding one of the plurality of light emission control lines to transmit an output signal from the shift register at this stage to the corresponding one of the plurality of light emission control lines.

In another aspect, the present disclosure provides a driving method for the shift register described above. The first clock signal and the second clock signal have a same frequency and phases different from each other by 180°. The driving method includes: applying, in a first time period, an input signal having an inactive level to the input signal terminal of the shift register, and providing a first clock signal having an active level and a second clock signal having an inactive level; applying, in a second time period, an input signal having an inactive level to the input signal terminal of the shift register, and providing a first clock signal having an inactive level and a second clock signal having an active level; applying, in a third time period, an input signal having an inactive level to the input signal terminal of the shift register, and providing a first clock signal having an active level and a second clock signal having an inactive level; applying, in a fourth time period, an input signal having an inactive level to the input signal terminal of the shift register, and providing a first clock signal having an inactive level and a second clock signal having an active level; applying, in a fifth time period, an input signal having an inactive level to the input signal terminal of the shift register, and providing a first clock signal having an active level and a second clock signal having an inactive level; applying, in a sixth time period, an input signal having an active level to the input signal terminal of the shift register, and providing a first clock signal having an inactive level and a second clock signal having an active level; applying, in a seventh time period, an input signal having an active level to the input signal terminal of the shift register, and providing a first clock signal having an active level and a second clock signal having an inactive level; and applying, in an eighth time period, an input signal having an active level to the input signal terminal of the shift register, and providing a first clock signal having an inactive level and a second clock signal having an active level. The first time period to the eighth time period are in a temporal sequence, and in a time period immediately preceding the first time period, the input signal has an active level.

In some embodiments, at a start of the first time period, as the first clock signal changes from an inactive level to an active level, the voltage at the first node changes from a second level to a first level, and at a start of the eighth time period, as the second clock signal changes from an inactive level to an active level, the voltage at the first node changes from the second level to a third level, where the first level is an inactive level, the second level and the third level are active levels, and the first level is lower than the second level, while the second level is lower than the third level.

In some embodiments, at a start of the second time period, as the second clock signal changes from an inactive level to an active level, the voltage at the second node changes from a fifth level to a sixth level, and at an end of the seventh time period, as the first clock signal changes from an active level to an inactive level, the voltage at the second node changes from the fifth level to a fourth level, where the fourth level is an inactive level, the fifth level and the sixth level are active levels, and the fourth level is lower than the fifth level, while the fifth level is lower than the sixth level.

BRIEF DESCRIPTION OF DRAWINGS

Accompanying drawings are provided for further understanding of the present disclosure and constitute a part of the specification. Hereinafter, these drawings are intended to explain the present disclosure together with the following specific embodiments, but should not be considered as a limitation to the present disclosure.

DETAIL DESCRIPTION OF EMBODIMENTS

Figure 1:
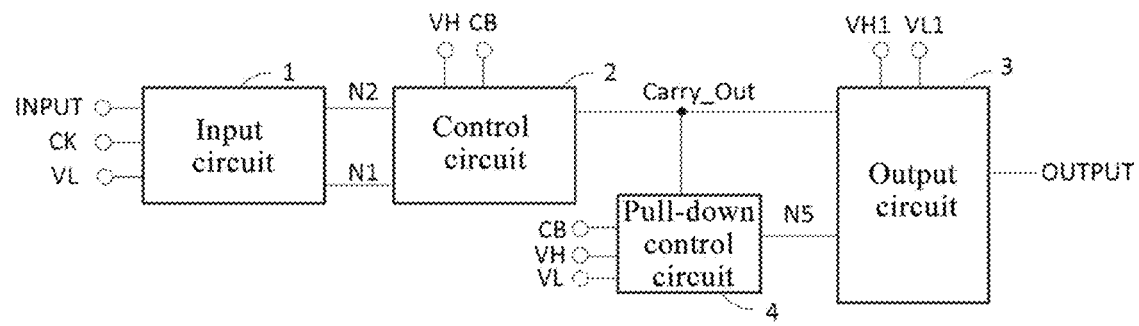
FIG. 1 is a block diagram of a shift register according to some embodiments of the present disclosure.

To improve understanding of the technical solution of the present disclosure for those skilled in the art, the present disclosure will be described in detail below with reference to accompanying drawings and specific implementations.

In this specification, the "active level" refers to a voltage capable of turning on a corresponding transistor, and the "inactive level" refers to a voltage capable of turning off a corresponding transistor. For example, where the transistor is an N-type transistor, the on level or active level may refer to a high level, and the off level or inactive level may refer to a low level.

In this specification, for a transistor element, the control electrode refers to a gate of the transistor, one of the first electrode and the second electrode refers to a source of the transistor, and the other refers to a drain of the transistor.

In this specification, when an element is referred to as being "connected" or "coupled" to another element, it may be directly connected or coupled to the other element or an intervening element may be present therebetween.

In this specification, the off level of a transistor refers to a level at which the transistor is turned off when the level is applied to the gate of the transistor.

In a display panel using a self-luminous device as a pixel, a pulse width modulation (PWM) signal is used to control the light emission time of the self-luminous device to implement grayscale display. In this case, in addition to a gate driver (GOA) for supplying a scanning signal to each row of pixels and a data driver for supplying a data signal to each column of pixels in a general display panel, a light emission control driver (EOA) for controlling light emission of each row of pixels is also desired. The light emission control driver may be formed by a plurality of cascaded shift registers to transfer a light emission control signal row by row for self-luminous devices arranged in a plurality of rows.

In general, a shift register may include a plurality of thin film transistors, and as the size of display panels increases, it is difficult to fabricate thin film transistors such as LTPS transistors on a large-sized substrate due to limitations in uniformity and reliability of the manufacturing process. Therefore, it is an industry trend to use N-type thin film transistors, particularly oxide thin film transistors having N-type conductivity, in a large-sized display panel.

The inventors have found that, in the EOA formed by oxide thin film transistors and the shift register circuit formed by the EOA in the related art, a pulse width of the light emission control signal to be output cannot be determined by a pulse width of the initial input signal. In general, each stage of shift register of the EOA may be implemented by adding an inverter to the circuit architecture of any stage of shift register of the GOA. Specifically, an input terminal of the inverter is connected to an output terminal of any stage of shift register circuit of the GOA, and an output terminal of the inverter outputs a light emission control signal to be provided to a pixel. In this case, the pulse width of the light emission control signal is determined by a pulse width of the clock signal. When a pixel is initialized, the output signal from each stage of shift register of the EOA remains in an Off state for a long time (for example, two clock cycles or more), and therefore, a plurality of control signals are provided to each stage of shift register of the EOA. Further, the light emission control signal may alternatively be obtained through other circuit structures (for example, a shift register designed for EOA) in the related art, but these circuit structures also have the above-described problems, and a large number of control signals or clock signals are desired.

Figure 8:
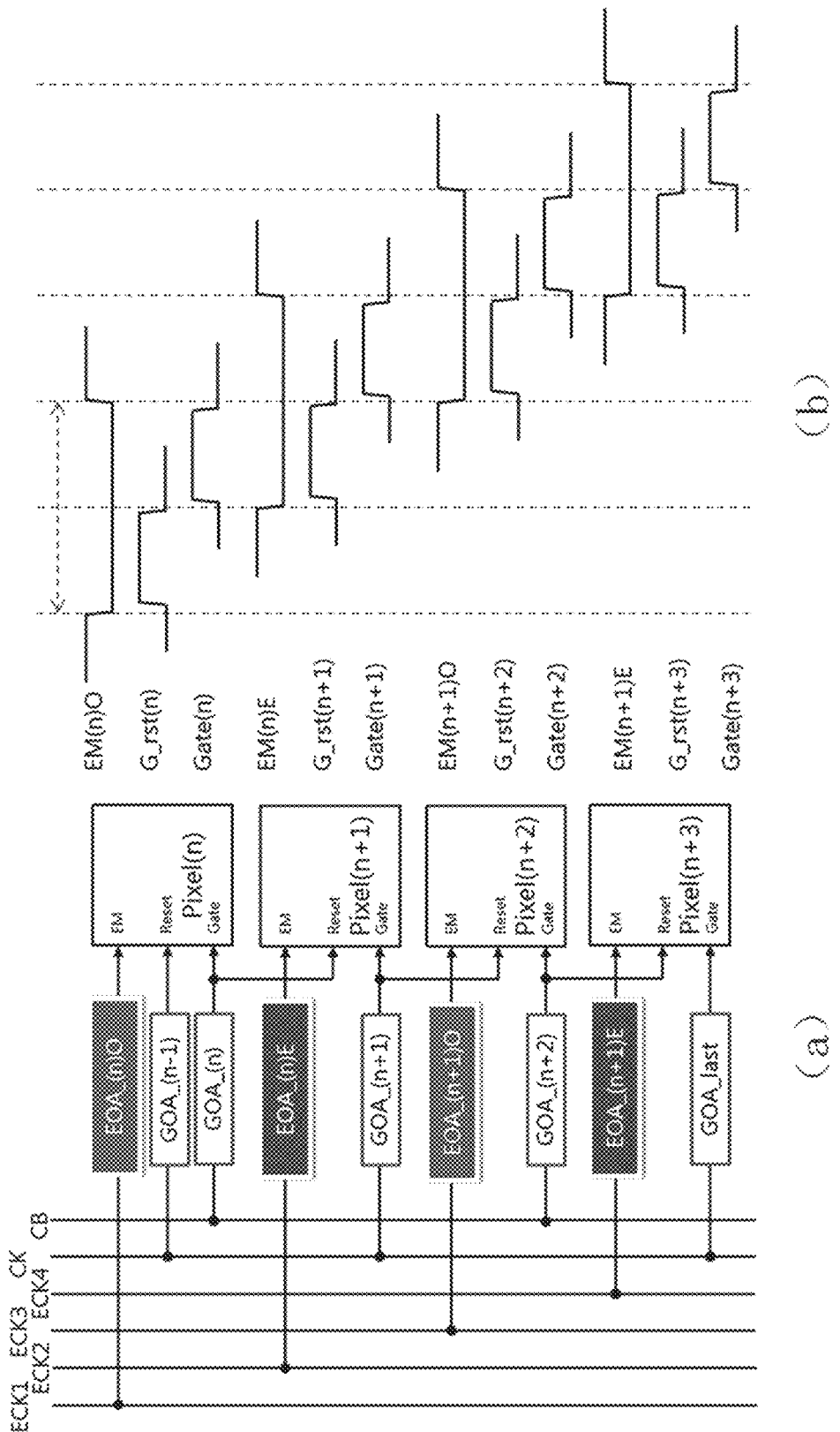
FIG. 8 is a block diagram and a timing diagram illustrating an arrangement of a light emission control driver in the related art.

FIG. 8 shows an example in which an EOA formed by oxide thin film transistors in the related art is applied and an operation timing thereof. Referring to FIG. 8, light emission control terminals EM of the pixels Pixel(n) in row n to the pixels Pixel(n+3) in row (n+3) are connected to the corresponding stage shift registers EOA_(n)O, EOA_(n)E, EOA_(n+1)O, and EOA_(n+1)E of the EOA, respectively, and reset terminals Reset and scanning control terminals Gate of the pixels Pixel(n) in row n to the pixels Pixel(n+3) in row (n+3) are connected to the corresponding stage shift registers GOA_(n−1) to GOA_(n+2) and GOA_last of the GOA, respectively. Since an output pulse width of each stage of shift register of the oxide thin film transistor EOA in the related art is determined by the clock pulse width, when a pixel is initialized, the output signal of the EOA is maintained at an off level, and thus, four clock signals, ECK1, ECK2, ECK3, and ECK4, are desired for the entire EOA.

To this end, the present disclosure provides, among other things, a shift register and a driving method thereof, a light emission control driver for a display apparatus, and a display apparatus, which substantially eliminate one or more of the problems due to limitations and disadvantages of the related art.

In one aspect, the present disclosure provides a shift register, including an input circuit, a first control circuit, a second control circuit, and an output circuit. All transistors included in the shift register are N-type transistors. Duration of a time period in which an output signal of the shift register has an inactive level depends on duration of a time period in which an input signal of the shift register has an inactive level. The inactive level is a level at which the N-type transistor is turned off.

FIG. 1 shows a block diagram of a shift register according to an embodiment of the present disclosure.

Referring to FIG. 1, the shift register may include an input circuit 1, a first control circuit 2, a second control circuit 3, and an output circuit 4.

The input circuit 1 may be connected to an input signal terminal INPUT, a first clock terminal CK, and a first node NODE1, and configured to receive an input signal applied to the input signal terminal INPUT and transmit, in response to a first clock signal applied to the first clock terminal, the input signal to the first node.

The first control circuit 2 may be connected to a second clock terminal CKB, a first power terminal VGL, the first node NODE1, and a second node NODE2, and configured to receive a first power signal applied to the first power terminal VGL and control, in response to a second clock signal applied to the second clock terminal CKB and a voltage at the second node NODE2, a voltage at the first node NODE1.

The second control circuit 3 may be connected to the first clock terminal CK, the second clock terminal CKB, the first power terminal VGL, a second power terminal VGH, the first node NODE1, the second node NODE2, and a fifth node NODE5, and configured to receive the first power signal and a second power signal applied to the second power terminal VGH, control, in response to a first clock signal, the second clock signal, and the voltage at the first node NODE1, a voltage at the second node NODE2, and control, in response to the second clock signal and the voltage at the first node NODE1, a voltage at the fifth node NODE5.

The output circuit 4 may be connected to the first node NODE1, the fifth node NODE5, the first power terminal VGL, the second power terminal VGH, and an output signal terminal OUT, and configured to transmit, in response to an active level at the first node NODE1, the second power signal to the output signal terminal OUT, and transmit, in response to an active level at the fifth node NODE5, the first power signal to the output signal terminal OUT.

The first power signal supplied from the first power terminal VGL may have a constant inactive level, and the second power signal supplied from the second power terminal VGH may have a constant inactive level.

In this shift register, as described later with reference to FIGS. 3 and 4A to 4J, duration of a time period in which an output signal output from the output signal terminal OUT has an inactive level depends on duration of a time period in which the input signal applied to the input signal terminal INPUT has an inactive level. For example, the duration (in other words, pulse width) of the time period in which the output signal has an inactive level may be substantially the same as the duration of the time period in which the input signal applied to the input signal terminal INPUT has an inactive level. Therefore, the number of control signals for the shift register can be reduced, and connection and wiring of the shift register are simplified.

In this shift register, as described later with reference to FIG. 2, all transistors included in the shift register may be N-type transistors. For example, all transistors are oxide thin film transistors having N-type conductivity. Therefore, the shift register may be suitable for a large-sized display panel. Apparently, in this case, the active level is a high level, the inactive level is a low level, and the first power signal is a power signal of a constant low level, while the second power signal is a power signal of a constant high level.

In this shift register, as will be described later, when the input signal has an inactive level and the first clock signal changes from an inactive level to an active level, the voltage at the first node NODE1 may change from a second level to a first level, and when the input signal has an active level and the second clock signal changes from an inactive level to an active level, the voltage at the first node NODE1 may change from the second level to a third level. The first level is an inactive level, the second level and the third level are active levels, and the first level is lower than the second level, while the second level is lower than the third level. The third level may be a higher level than the high level of the second power signal.

In this shift register, as will be described later, when the input signal has an inactive level and the second clock signal changing from an inactive level to an active level, the voltage at the second node NODE2 may change from a fifth level to a sixth level, and when the input signal has an active level and the first clock signal changing from an active level to an inactive level, the voltage at the second node NODE2 may change from the fifth level to a fourth level. The fourth level is an inactive level, the fifth level and the sixth level are active levels, and the fourth level is lower than the fifth level, while the fifth level is lower than the sixth level. The sixth level may be a higher level than the high level of the second power signal.

Based on the above level changes at the first node NODE1 and the second node NODE2, the pulse width of the output signal from the output signal terminal OUT may be adjusted according to the pulse width of the input signal. Therefore, the number of control signals for the shift register can be reduced, and connection and wiring of the shift register are simplified.

Figure 2:
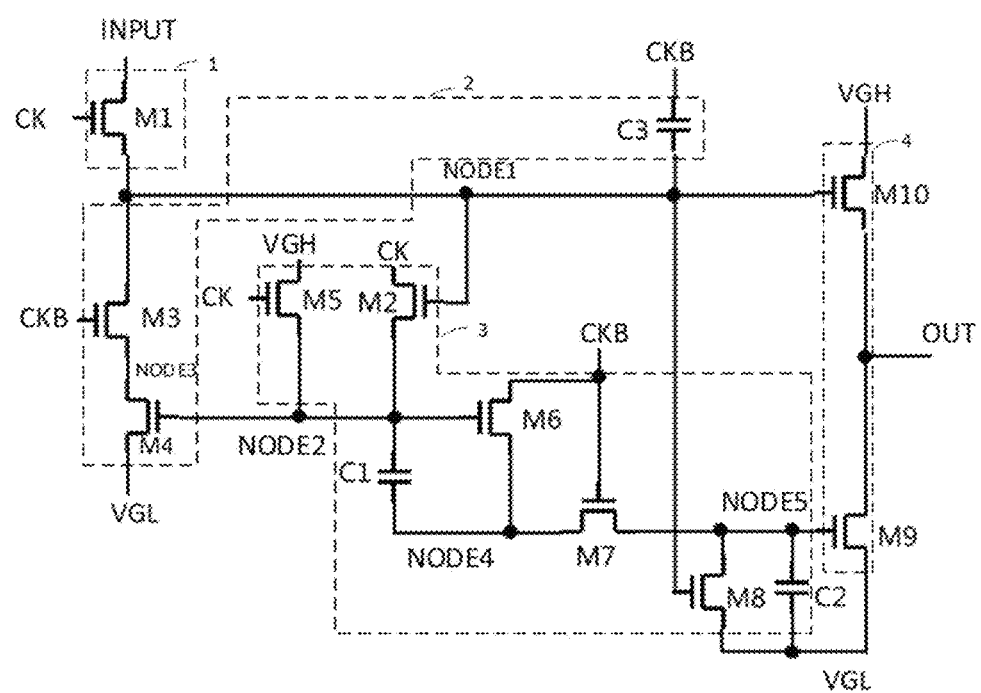
FIG. 2 is a circuit diagram of a shift register according to some embodiments of the present disclosure.

FIG. 2 shows a circuit diagram of a shift register according to some embodiments of the present disclosure.

In some embodiments, referring to FIG. 2, the input circuit 1 may include a first input transistor M1. The first input transistor M1 has a control electrode connected to the first clock terminal CK, a first electrode connected to the input signal terminal INPUT, and a second electrode connected to the first node NODE1.

In some embodiments, referring to FIG. 2, the first control circuit 2 may include a first control transistor M3, a second control transistor M4, and a first control capacitor C3. The first control transistor M3 has a control electrode connected to the second clock terminal CKB, a first electrode connected to the first node NODE1, and a second electrode connected to a third node NODE3. The second control transistor M4 has a control electrode connected to the second node NODE2, a first electrode connected to the third node NODE3, and a second electrode connected to the first power terminal VGL. The first control capacitor C3 has a first terminal connected to the second clock terminal CKB, and a second terminal connected to the first node NODE1.

In some embodiments, referring to FIG. 2, the second control circuit 3 may include a third control transistor M2, a fourth control transistor M5, a fifth control transistor M6, a sixth control transistor M7, and a second control capacitor C1. The third control transistor M2 has a control electrode connected to the first node NODE1, a first electrode connected to the first clock terminal CK, and a second electrode connected to the second node NODE2. The fourth control transistor M5 has a control electrode connected to the first clock terminal CK, a first electrode connected to the second power terminal VGH, and a second electrode connected to the second node NODE2. The fifth control transistor M6 has a control electrode connected to the second node NODE2, a first electrode connected to the second clock terminal CKB, and a second electrode connected to a fourth node NODE4. The sixth control transistor M7 has a control electrode connected to the second clock terminal CKB, a first electrode connected to the fourth node NODE4, and a second electrode connected to the fifth node NODE5. The second control capacitor C1 has a first terminal connected to the second node NODE2, and a second terminal connected to the fourth node NODE4.

In some embodiments, referring to FIG. 2, the second control circuit 3 may further include a seventh control transistor M8 and a third control capacitor C2. The seventh control transistor M8 has a control electrode connected to the first node NODE1, a first electrode connected to the fifth node NODE5, and a second electrode connected to the first power terminal VGL. The third control capacitor C2 has a first terminal connected to the fifth node NODE5, and a second terminal connected to the first power terminal VGL.

In some embodiments, referring to FIG. 2, the output circuit 4 may include a first output transistor M10 and a second output transistor M9. The first output transistor M10 has a control electrode connected to the first node NODE1, a first electrode connected to the second power terminal VGH, and a second electrode connected to the output signal terminal OUT. The second output transistor M9 has a control electrode connected to the fifth node NODE5, a first electrode connected to the output signal terminal OUT, and a second electrode connected to the first power terminal VGL.

The operation of the shift register according to an embodiment of the present disclosure is described below with reference to FIGS. 3 and 4A to 4J.

It should be noted that the first clock signal applied to the first clock terminal CK and the second clock signal applied to the second clock terminal CKB have a same frequency and phases different from each other by 180°. Since it is difficult for the clock signal (including the first clock signal applied to the first clock terminal CK and the second clock signal applied to the second clock terminal CKB) to realize ideal instantaneous transitions between high and low levels, i.e., there is a rise time when the clock signal is switched from a low level to a high level and a fall time when the clock signal is switched from a high level to a low level; and in order to avoid interference between different clock signals due to the level transition, there is no overlap between the rise time and the fall time (or the rise time) of any two clock signals (e.g., the first clock signal applied to the first clock terminal CK and the second clock signal applied to the second clock terminal CKB). In an embodiment of the present disclosure, for a time period in which the first clock signal applied to the first clock terminal CK has a high level, a rise time in which the first clock signal is changed from low to high is included at the beginning of the time period, and a fall time in which the first clock signal is changed from high to low is included at the end of the time period. In contrast, for a time period in which the first clock signal applied to the first clock terminal CK has a low level, the first clock signal is shown to have a constant low level. Likewise, for a time period in which the first clock signal applied to the second clock terminal CK has a high level, a rise time in which the second clock signal is changed from low to high is included at the beginning of the time period, and a fall time in which the second clock signal is changed from high to low is included at the end of the time period. In contrast, for a time period in which the second clock signal applied to the second clock terminal CK has a low level, the second clock signal is shown to have a constant low level.

Before a first time period T1, the input signal applied to the input signal terminal INPUT has a high level.

In the first time period T1, the input signal applied to the input signal terminal INPUT has a low level, the first clock signal applied to the first clock terminal CK has a high level, and the second clock signal applied to the second clock terminal CKB has a low level. In this case, the input circuit 1 transmits the input signal to the first node NODE1, and the second control circuit 3 transmits the high-level power signal applied to the second power terminal VGH to the second node NODE2.

Figure 3:
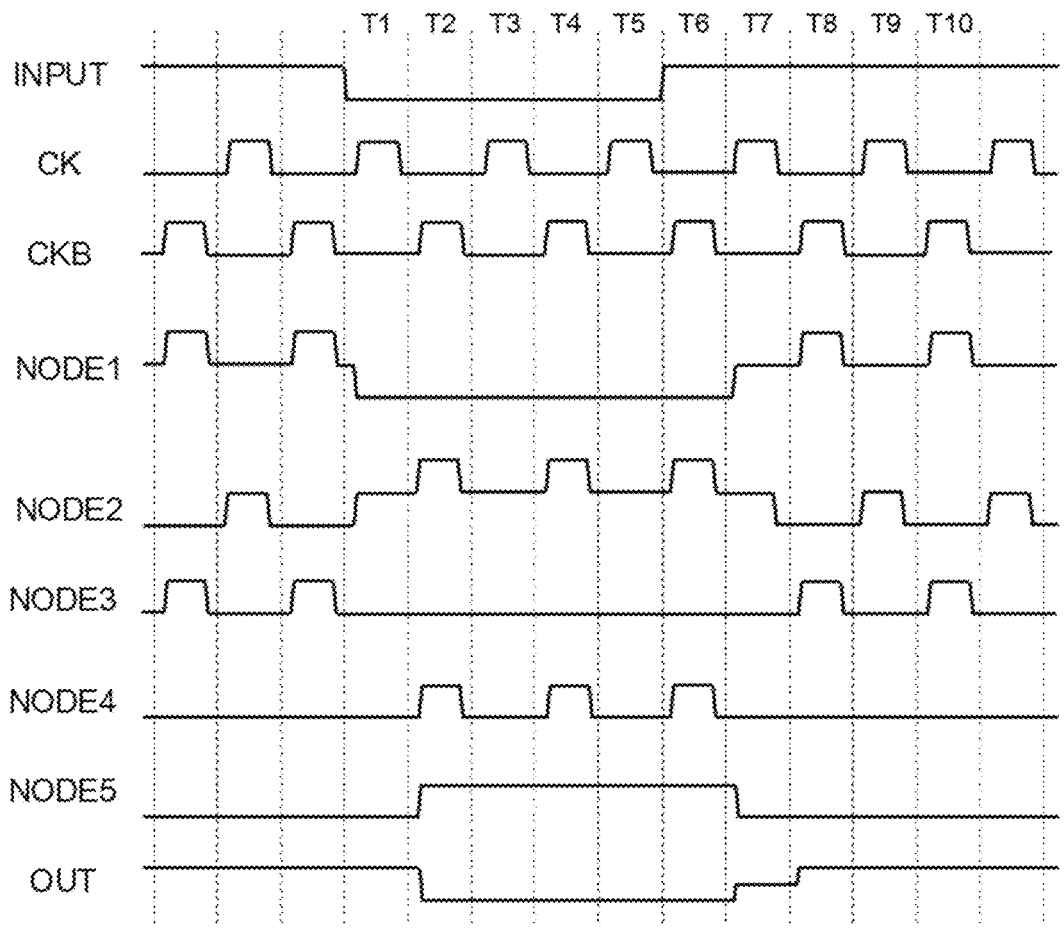
FIG. 3 is a timing diagram illustrating operations of a shift register according to some embodiments of the present disclosure.
Figure 4A:
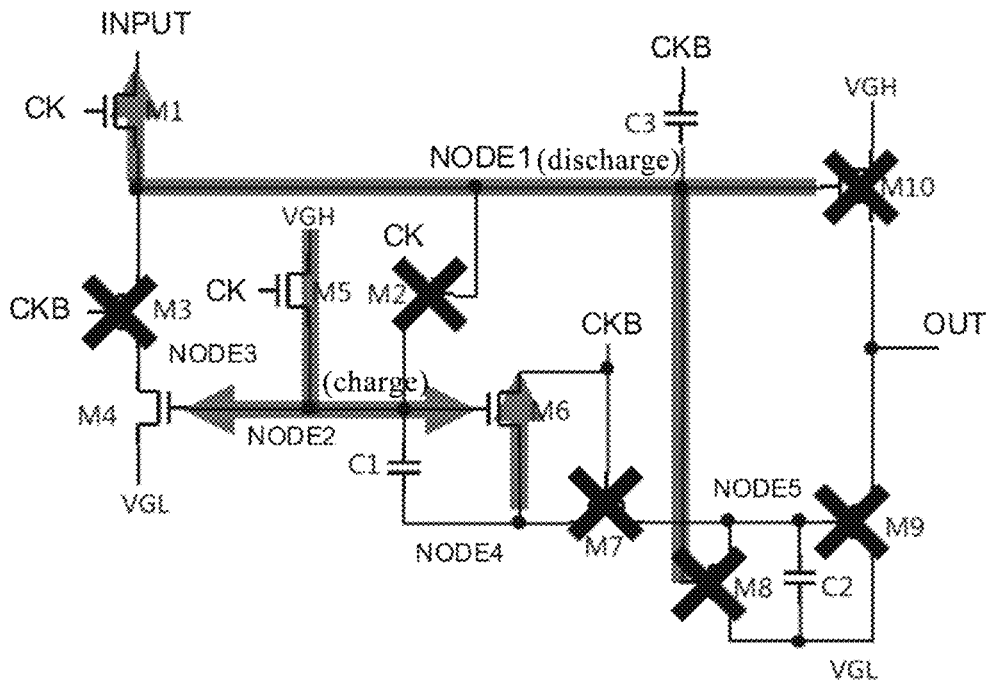
FIGS. 4A to 4J are diagrams illustrating operating states of the shift register of FIG. 2 in different time periods.

Specifically, referring to FIGS. 3 and 4A, the first input transistor M1 is turned on, and the first node NODE1 is discharged through the first input transistor M1, so that the level at the first node NODE1 is decreased to a first level substantially the same as the level of the input signal of the input signal terminal INPUT. Therefore, the first level is a low level. The fourth control transistor M5 is turned on, and the second node NODE2 is charged through the fourth control transistor M5, so that the voltage at the second node NODE2 is charged to a fifth level substantially the same as the level of the second power signal. The fifth level is a high level. The second control transistor M4 is turned on, and the third node NODE3 is discharged to a low level through the second control transistor M4. The fifth control transistor M6 is turned on, and the fourth node NODE4 has substantially the same level, i.e., a low level, as the second clock signal at the second clock terminal CKB. Since both the sixth control transistor M7 and the seventh control transistor M8 are turned off, the fifth node NODE5 is in a floating state, and maintains the level before the first time period T1, i.e., a low level. The first output transistor M10 and the second output transistor M9 are turned off due to the low voltage at the first node NODE1 and the fifth node NODE5, so that the output signal terminal OUT is in a floating state, and maintains the level before the first time period T1.

In a second time period T2, the input signal applied to the input signal terminal INPUT has a low level, the first clock signal applied to the first clock terminal CK has a low level, and the second clock signal applied to the second clock terminal CKB has a high level. In this case, the second control circuit 3 increases the voltage at the second node NODE2 from the fifth level to a sixth level higher than the fifth level, and the first control circuit 2 controls the voltage at the first node NODE1 to a low level.

Figure 4B:
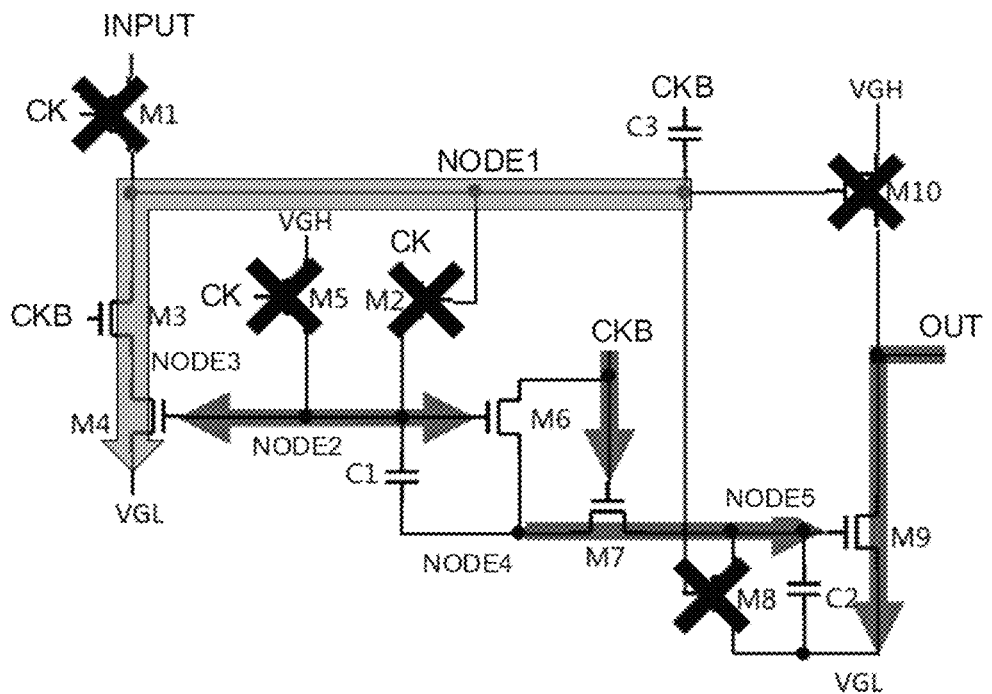

Specifically, referring to FIGS. 3 and 4B, the fifth control transistor M6 is turned on, and the fourth node NODE4 has substantially the same level, i.e., a high level, as the second clock signal at the second clock terminal CKB. In this case, since the third control transistor M2 and the fourth control transistor M5 are turned off, the second node NODE2 is in a floating state, and is further raised from the fifth level to the sixth level by a bootstrap effect of the second control capacitor C1. The second control transistor M4 and the first control transistor M3 are turned on, the first node NODE1 is discharged through the second control transistor M4 and the first control transistor M3, so that the voltage at the first node NODE1 is maintained at a low level, and since the second control transistor M4 is turned on, the voltage at the third node NODE3 is substantially the same as the level of the first power terminal VGL. The sixth control transistor M7 is turned on, and the high level at the fourth node NODE4 is transmitted to the fifth node NODE5 through the sixth control transistor M7, so that the voltage at the fifth node NODE5 is at a high level. The second output transistor M9 is turned on under the control of the fifth node NODE5, so that the output signal output from the output signal terminal OUT has a low level.

In a third time period T3, the input signal applied to the input signal terminal INPUT has a low level, the first clock signal applied to the first clock terminal CK has a high level, and the second clock signal applied to the second clock terminal CKB has a low level. In this case, the second control circuit 3 reduces the voltage at the second node NODE2 from the sixth level to the fifth level, and the input circuit 1 controls the voltage at the first node NODE1 to a low level.

Figure 4C:
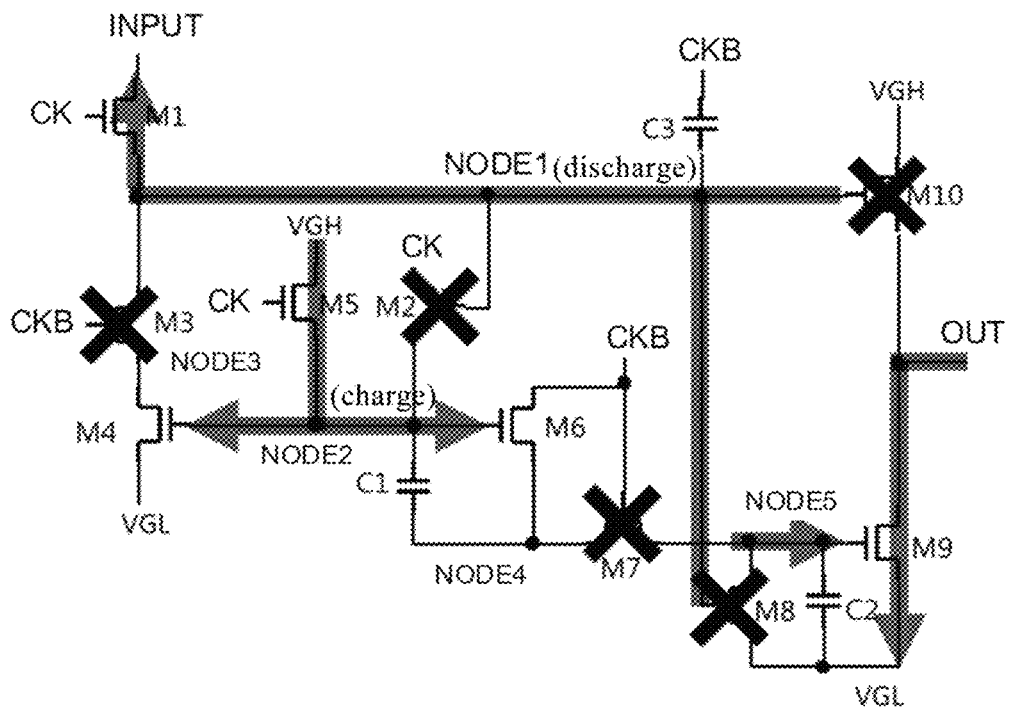

Specifically, referring to FIGS. 3 and 4C, the first input transistor M1 is turned on so that the voltage at the first node NODE1 is at a low level substantially the same as the level at the input signal terminal INPUT, and the third control transistor M2, the seventh control transistor M8, and the first output transistor M10 are turned off. The fourth control transistor M5 is turned on so that the voltage at the second node NODE2 is at the fifth level. The second control transistor M4 is turned on, and the third node NODE3 has substantially the same level, i.e., a low level, as the first power terminal VGL. The fifth control transistor M6 is turned on, and the fourth node NODE4 has substantially the same level, i.e., a low level, as the second clock signal at the second clock terminal CKB. The sixth control transistor M7 is turned off, and the voltage at the fifth node NODE5 is maintained at a high level due to the third control capacitor C2. Therefore, the second output transistor M9 remains on, and the output signal output from the output signal terminal OUT has a low level.

In a fourth time period T4, the input signal applied to the input signal terminal INPUT has a low level, the first clock signal applied to the first clock terminal CK has a low level, and the second clock signal applied to the second clock terminal CKB has a high level. In this case, the second control circuit 3 increases the voltage at the second node NODE2 from the fifth level to a sixth level higher than the fifth level, and the first control circuit 2 controls the voltage at the first node NODE1 to a low level.

Figure 4D:
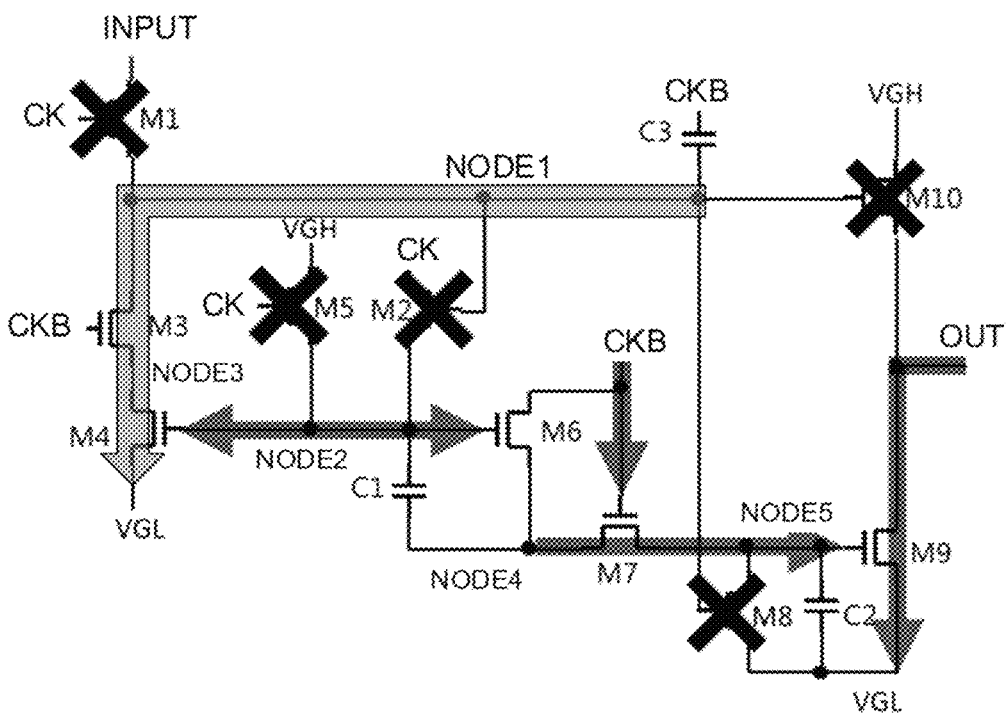

Specifically, referring to FIGS. 3 and 4D, The fifth control transistor M6 is turned on, and the fourth node NODE4 has substantially the same level, i.e., a high level, as the second clock signal at the second clock terminal CKB. In this case, the second node NODE2 is in a floating state, and is further raised from the fifth level to the sixth level by a bootstrap effect of the second control capacitor C1. The second control transistor M4 and the first control transistor M3 are turned on, and the first node NODE1 is discharged through the second control transistor M4 and the first control transistor M3, so that the voltage at the first node NODE1 is maintained at a low level, and since the second control transistor M4 is turned on, the voltage at the third node NODE3 is substantially the same as the level of the first power terminal VGL, i.e., at a low level. The sixth control transistor M7 is turned on, and the level at the fourth node NODE4 is transmitted to the fifth node NODE5 through the sixth control transistor M7, so that the voltage at the fifth node NODE5 is at a high level. The second output transistor M9 is turned on under the control of the high voltage at the fifth node NODE5, so that the output signal output from the output signal terminal OUT has a low level.

In a fifth time period T5, the input signal applied to the input signal terminal INPUT has a low level, the first clock signal applied to the first clock terminal CK has a high level, and the second clock signal applied to the second clock terminal CKB has a low level. In this case, the second control circuit 3 reduces the voltage at the second node NODE2 from the sixth level to the fifth level, and the input circuit 1 controls the voltage at the first node NODE1 to a low level.

Figure 4E:
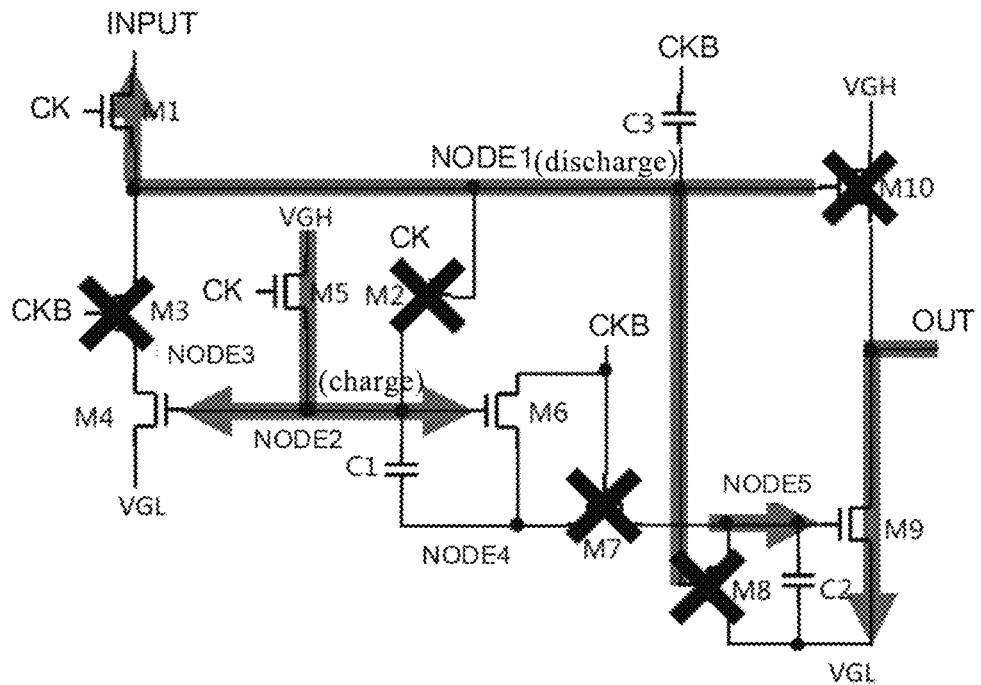

Specifically, referring to FIGS. 3 and 4E, the first input transistor M1 is turned on so that the voltage at the first node NODE1 is maintained at a low level, and the third control transistor M2, the seventh control transistor M8, and the first output transistor M10 are turned off. The fourth control transistor M5 is turned on so that the voltage at the second node NODE2 is at the fifth level. The second control transistor M4 is turned on, and the third node NODE3 has substantially the same level, i.e., a low level, as the first power terminal VGL. The fifth control transistor M6 is turned on, and the fourth node NODE4 has substantially the same level, i.e., a low level, as the second clock signal at the second clock terminal CKB. The sixth control transistor M7 is turned off, and the voltage at the fifth node NODE5 is maintained at a high level due to the third control capacitor C2. Therefore, the second output transistor M9 remains on, and the output signal output from the output signal terminal OUT has a low level.

In a sixth time period T6, the input signal applied to the input signal terminal INPUT has a high level, the first clock signal applied to the first clock terminal CK has a low level, and the second clock signal applied to the second clock terminal CKB has a high level. In this case, the second control circuit 3 increases the voltage at the second NODE2 from the fifth level to a sixth level higher than the fifth level, and the first control circuit 2 controls the voltage at the first node NODE1 to a low level.

Figure 4F:
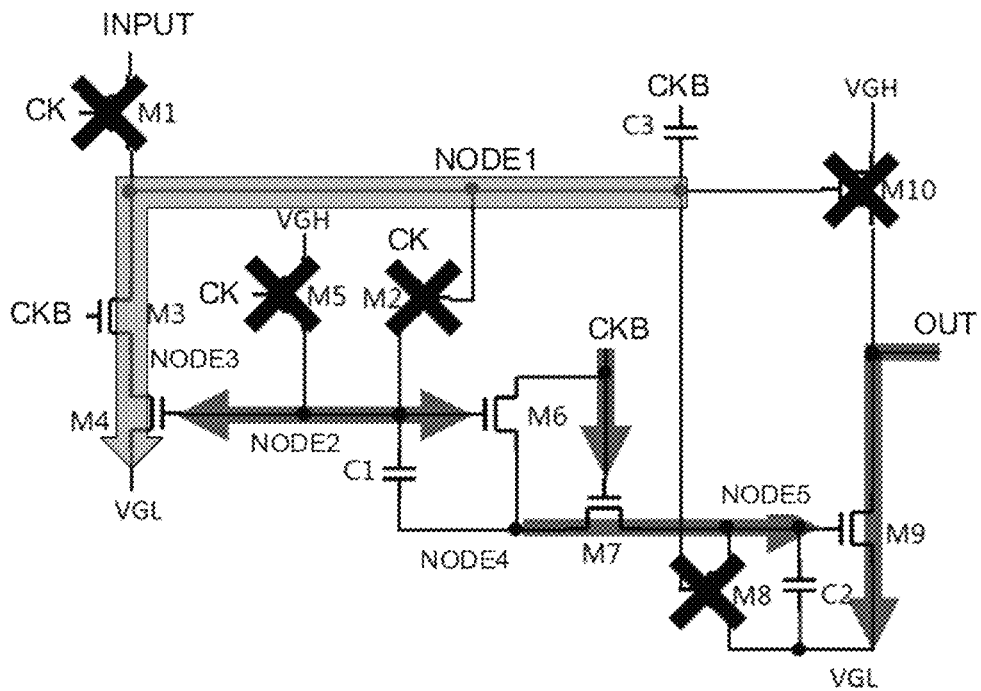

Specifically, referring to FIGS. 3 and 4F, the fifth control transistor M6 is turned on, and the fourth node NODE4 has substantially the same level. i.e., a high level, as the second clock signal at the second clock terminal CKB. In this case, the second node NODE2 is in a floating state, and is further raised from the fifth level to the sixth level by a bootstrap effect of the second control capacitor C1. The second control transistor M4 and the first control transistor M3 are turned on, and the first node NODE1 is discharged through the second control transistor M4 and the first control transistor M3, so that the voltage at the first node NODE1 is maintained at a low level, and the voltage at the third node NODE3 is also at a low level. The sixth control transistor M7 is turned on, and the high level at the fourth node NODE4 is transmitted to the fifth node NODE5 through the sixth control transistor M7, so that the voltage at the fifth node NODE5 is at a high level. The second output transistor M9 is turned on under the control of the high voltage at the fifth node NODE5, so that a low level is output from the output signal terminal OUT.

In a seventh time period T7, the input signal applied to the input signal terminal INPUT has a high level, the first clock signal applied to the first clock terminal CK has a high level, and the second clock signal applied to the second clock terminal CKB has a low level. In this case, the input circuit 1 transmits the input signal to the first node NODE1, and the second control circuit 3 reduces the voltage at the second node NODE2 from the sixth level to the fifth level.

Figure 4G:
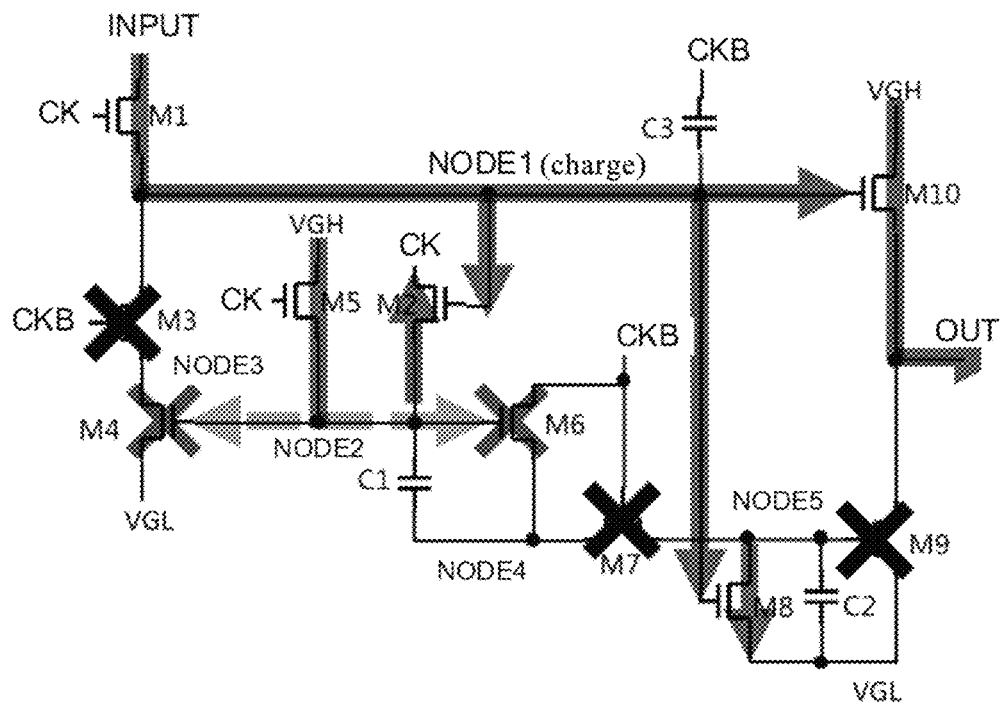

Specifically, referring to FIGS. 3 and 4G, the first input transistor M1 is turned on, and the first node NODE1 has a second level substantially the same as the level of the input signal of the input signal terminal INPUT. The second level is a high level. In this case, the third control transistor M2, the seventh control transistor M8, and the first output transistor M10 are turned on. The fourth control transistor M5 is turned on, so that the voltage at the second node NODE2 is substantially the same as the high-level power signal at the second power terminal VGH, and the second control transistor M4 and the fifth control transistor M6 are turned on. The third node NODE3 is discharged through the second control transistor M4, so that the voltage at the third node NODE3 is maintained at a low level. The fourth node NODE4 is discharged through the fifth control transistor M6, so that the voltage at the fourth node NODE4 is at a low level. The fifth node NODE5 is discharged through the seventh control transistor M8, so that the voltage at the fifth node NODE5 is at a low level. At the end of the seventh time period T7, when the first clock signal changes from a high level to a low level, the second node NODE2 is discharged through the third control transistor M2, so that the voltage at the second node NODE2 is decreased from the fifth level to a fourth level substantially the same as the level of the second clock signal of the second clock terminal CKB. The fourth level is a low level. In the seventh time period T7, the second output transistor M9 is turned off, and the first output transistor M10 is turned on, so that the output signal output from the output signal terminal OUT has a high level.

In an eighth time period T8, the input signal applied to the input signal terminal INPUT has a high level, the first clock signal applied to the first clock terminal CK has a low level, and the second clock signal applied to the second clock terminal CKB has a high level. In this case, the first control circuit 2 controls the voltage at the first node NODE1 to a third level, and the second control circuit 3 controls the voltage at the second node NODE2 to a low level.

Figure 4H:
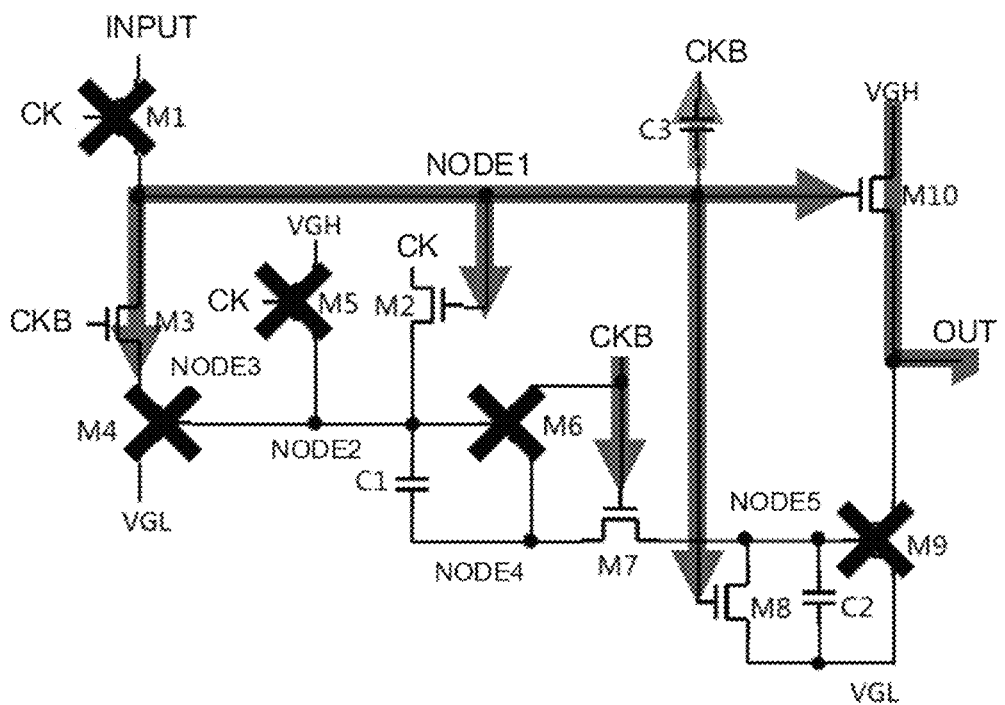

Specifically, referring to FIGS. 3 and 4H, since the voltage at the second node NODE2 has been decreased to the low level at the end of the seventh time period, the second control transistor M4 and the fifth control transistor M6 are turned off. Since the first input transistor M1 is also turned off, the first node NODE1 is in a floating state, and the second clock signal applied to the second clock terminal CKB has a high level, so that the voltage at the first node NODE1 is further raised from the second level to the third level due to the bootstrap effect of the first control capacitor C3. The third control transistor M2, the first control transistor M3, the seventh control transistor M8, and the first output transistor M10 are turned on. The third node NODE3 is charged through the first control transistor M3, so that the voltage at the third node NODE3 is changed to a high level. The voltage at the fifth node NODE5 is maintained at a low level since the seventh control transistor M8 is turned on, so that the second output transistor M9 is turned off. A high level is output from the output signal terminal OUT. Since the voltage at the first node NODE1 is at the third level higher than the second level, the level of the output signal is slightly higher in the eighth time period T8 than in the seventh time period T7.

In a ninth time period T9, the input signal applied to the input signal terminal INPUT has a high level, the first clock signal applied to the first clock terminal CK has a high level, and the second clock signal applied to the second clock terminal CKB has a low level. In this case, the input circuit 1 transmits the input signal to the first node NODE1, and the second control circuit 3 controls the voltage at the second node NODE2 to the fifth level.

Figure 4I:
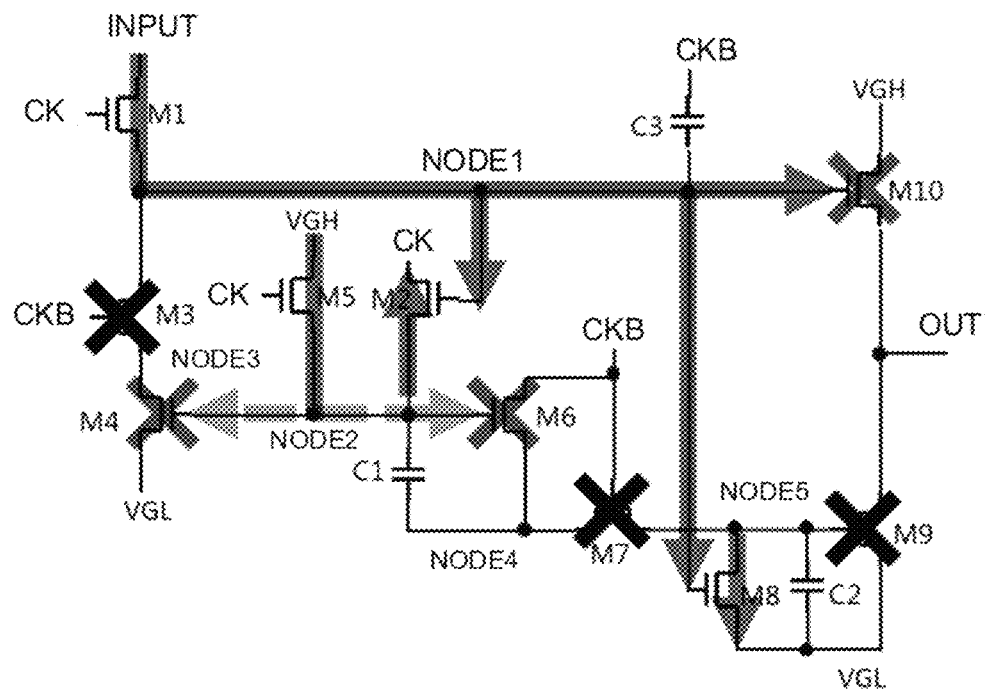

Specifically, referring to FIGS. 3 and 4I, the first input transistor M1 is turned on, and the first node NODE1 is charged through the first input transistor M1, so that the voltage at the first node NODE1 is substantially the same as the level of the input signal of the input signal terminal INPUT, i.e., at a high level. In this case, the third control transistor M2, the seventh control transistor M8, and the first output transistor M10 are turned on. The fourth control transistor M5 is turned on, so that the voltage at the second node NODE2 is at the fifth level substantially the same as the high-level power signal at the second power terminal VGH, and the second control transistor M4 and the fifth control transistor M6 are turned on. The third node NODE3 is discharged through the second control transistor M4, so that the voltage at the third node NODE3 is maintained at a low level. The fourth node NODE4 is discharged through the fifth control transistor M6, so that the voltage at the fourth node NODE4 is at a low level. The fifth node NODE5 is discharged through the seventh control transistor M8, so that the voltage at the fifth node NODE5 is at a low level. At the end of the ninth time period T9, when the first clock signal changes from a high level to a low level, the second node NODE2 is discharged through the third control transistor M2, so that the voltage at the second node NODE2 is decreased from the fifth level to a low level. In the eighth time period T7, the second output transistor M9 is turned off, and the first output transistor M10 is turned on, so that the output signal output from the output signal terminal OUT has a high level.

In a tenth time period T10, the input signal applied to the input signal terminal INPUT has a high level, the first clock signal applied to the first clock terminal CK has a high level, and the second clock signal applied to the second clock terminal CKB has a low level. In this case, the first control circuit 2 controls the voltage at the first node NODE1 to a third level, and the second control circuit 3 controls the voltage at the second node NODE2 to a low level.

Figure 4J:
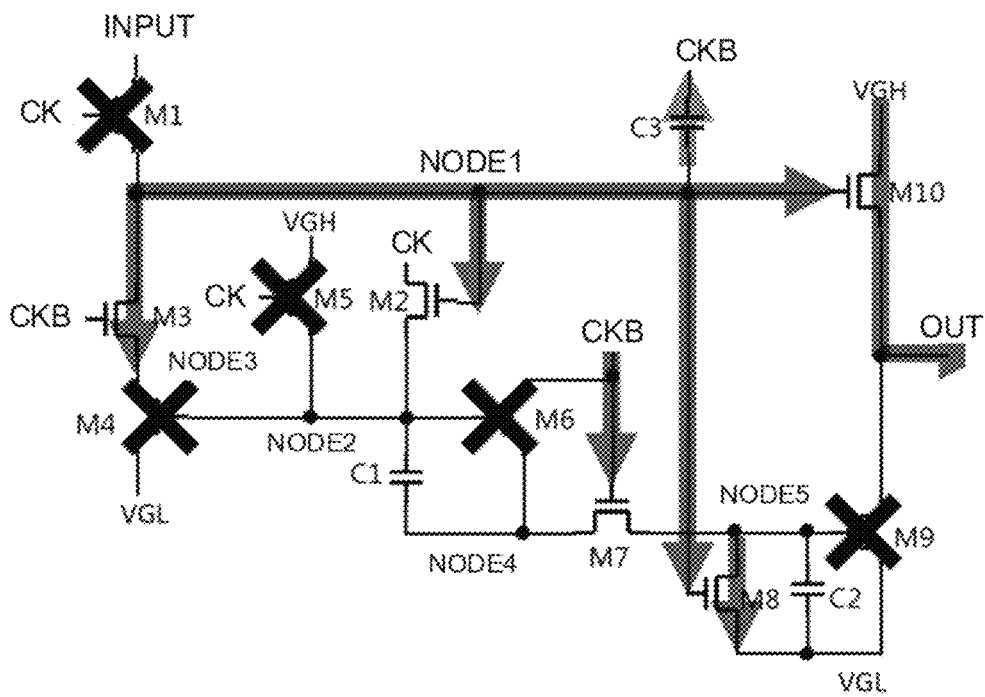

Specifically, referring to FIGS. 3 and 4J, the second control transistor M4 and the fifth control transistor M6 are turned off. Since the first input transistor M1 is also turned off, the first node NODE1 is in a floating state, while a high-level clock signal is applied to the second clock terminal CKB so that the voltage at the first node NODE1 is raised to the third level due to the bootstrap effect of the first control capacitor C3. The third control transistor M2, the first control transistor M3, the seventh control transistor M8, and the first output transistor M10 are turned on. The second node NODE2 is discharged through the third control transistor M2, so that the voltage at the second node NODE2 changes to a low level substantially the same as the first clock signal. The third node NODE3 is charged through the first control transistor M3, so that the voltage at the third node NODE3 is changed to a high level. The voltage at the fifth node NODE5 is maintained at a low level since the seventh control transistor M8 is turned on, so that the second output transistor M9 is turned off. The output signal output from the output signal terminal OUT has a high level.

Thereafter, the input signal applied to the input signal terminal INPUT maintains the high level, and the first clock signal and the second clock signal continue to maintain the original frequency for switching between the high and low levels, until a next first time period T1 is performed in response to a change in the input signal (e.g., the input signal changes from the high level to the low level again).

It should be noted that the second level and the fifth level may be the same as or different from each other, which is not limited in the present disclosure as long as the second level and the fifth level are both active levels. Likewise, the first level and the fourth level may be the same as or different from each other, which is not limited in the present disclosure as long as the first level and the fourth level are both inactive levels.

In the shift register according to the embodiments of the present disclosure, all transistors included in the shift register may be N-type transistors (e.g., oxide thin film transistors having N-type conductivity). Therefore, the shift register may be suitable for a large-sized display panel. In addition, the pulse width of the output signal from the output signal terminal OUT may be adjusted according to the pulse width of the input signal. Therefore, the number of control signals for the shift register can be reduced, and connection and wiring of the shift register are simplified.

In another aspect, the present disclosure provides a light emission control driver, including a plurality of cascaded shift registers each being a shift register described above.

Figure 5:
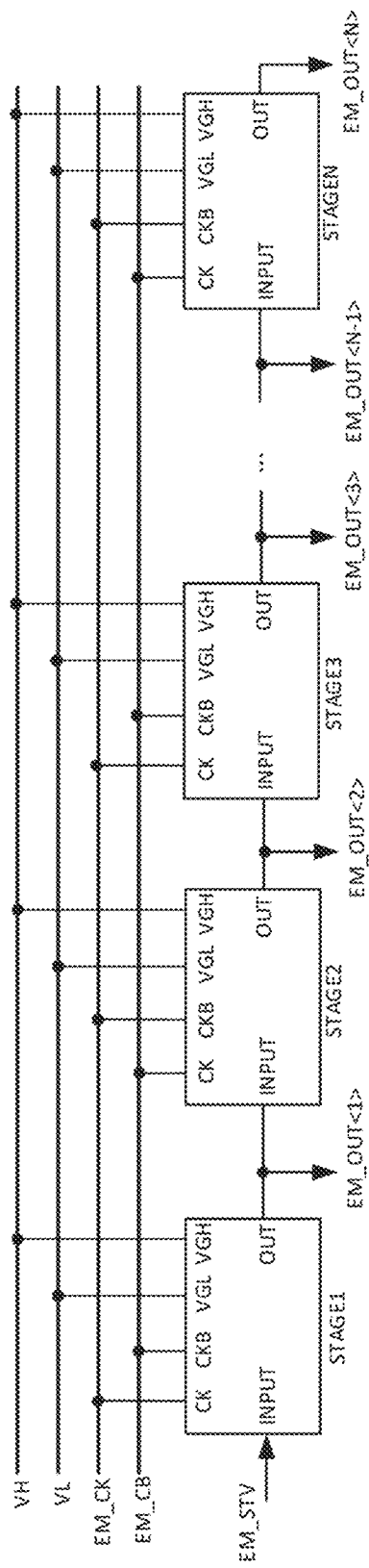
FIG. 5 is a block diagram of a light emission control driver according to some embodiments of the present disclosure.

For example, referring to FIG. 5, the light emission control driver includes N cascaded shift registers (hereinafter, N stage shift registers). A scanning start signal EM_STV is applied to an input signal terminal of a first stage of shift register, an input signal terminal of an $i^{th}$ stage of shift register is connected to a signal output terminal of an $(i-1)^{th}$ stage of shift register ($2 \leq i \leq N$), and the stage shift registers output stage signals EM_OUT<1> to EM_OUT<N>, respectively. For example, when the light emission control driver is used to drive pixels in a display panel, each stage of shift register outputs a light emission control signal for a corresponding row of pixels. A first clock terminal CK and a second clock terminal CKB of each stage of shift register are alternately connected to a first clock signal line EM_CK and a second clock signal line EM_CKB, respectively. For example, referring to FIG. 5, the first clock terminal CK of an odd-numbered stage of shift register is connected to the first clock signal line EM_CK, while the second clock terminal CKB thereof is connected to the second clock signal line EM_CKB. The first clock terminal CK of an even-numbered stage of shift register is connected to the second clock signal line EM_CKB, while the second clock terminal CKB thereof is connected to the first clock signal line EM_CK. The clock signal applied to the first clock signal line EM_CK and the clock signal EM_CKB applied to the second clock signal line have a same frequency and phases different from each other by 180°.

In the light emission control driver according to the embodiment of the present disclosure, all transistors included in the light emission control driver may be N-type transistors (e.g., oxide thin film transistors having N-type conductivity). Therefore, the light emission control driver may be suitable for a large-sized display panel. In addition, since the pulse width of the output signal from the output signal terminal OUT of each stage of shift register is adjusted according to the pulse width of the input signal, the pulse width of the light emission control signal output from each stage of shift register can be directly determined by setting a pulse width of the scanning start signal EM_STV without any more complicated clock design or additional initialization control signal. Therefore, the number of control signals can be reduced, connection and wiring can be simplified, and the design of a narrow-bezel/bezel-less display panel is facilitated.

In another aspect, the present disclosure provides a display apparatus, including the light emission control driver described above.

Figure 6:
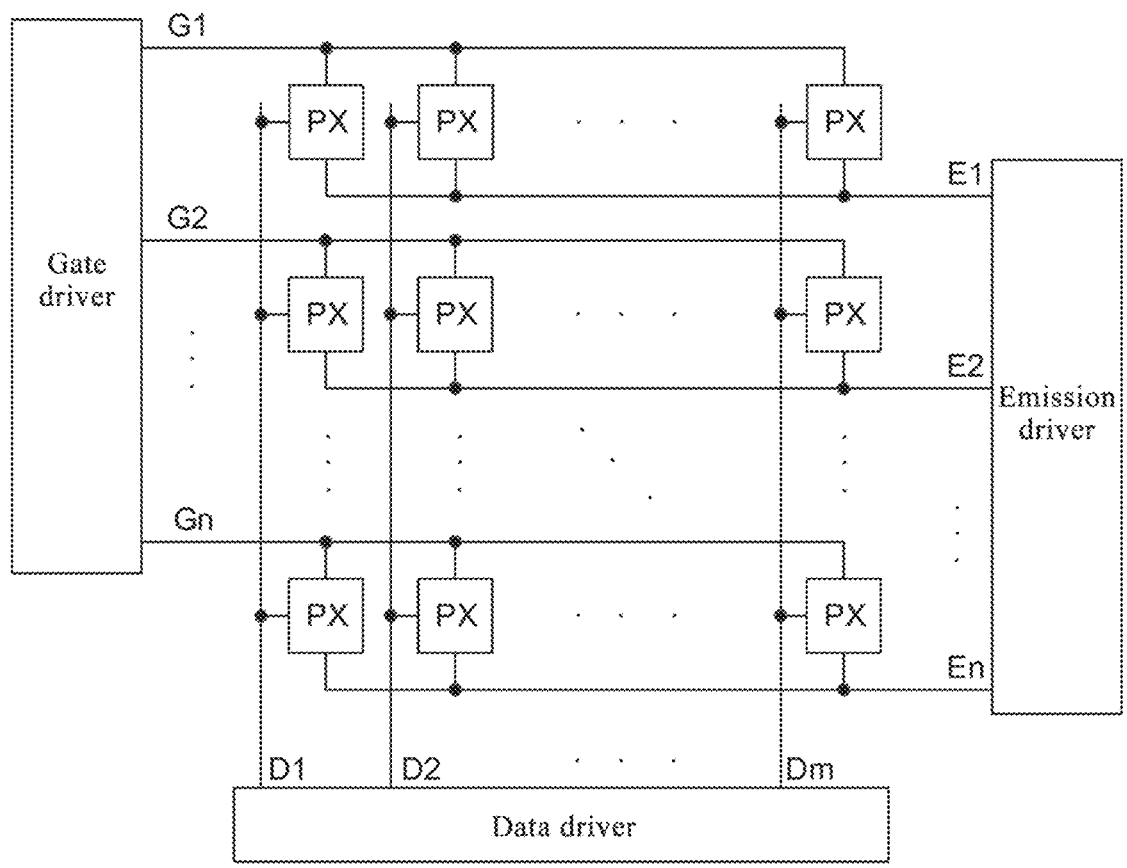
FIG. 6 is a block diagram of a display apparatus according to some embodiments of the present disclosure.

FIG. 6 shows a display apparatus according to some embodiments of the present disclosure. The display apparatus includes a plurality of pixels PX and a light emission control driver according to an embodiment of the present disclosure. The plurality of pixels PX are arranged in a plurality of rows and columns. For example, referring to FIG. 6, the plurality of pixels PX are arranged in n rows and m columns, each row of pixels PX are connected to a corresponding one of a plurality of gate lines G1 to Gn and a corresponding one of a plurality of light emission control lines E1 to En, and each column of pixels PX are connected to a corresponding one of a plurality of data lines D1 to Dm. An output signal terminal of each stage of shift register in the light emission control driver is connected to a corresponding one of the plurality of light emission control lines E1 to En, so as to transmit a corresponding light emission control signal (referring to EM_OUT<1> to EM_OUT<N> in FIG. 5) to the light emission control lines E1 to En.

As shown in FIG. 6, the display apparatus may further include a gate driver and a data driver configured to supply scanning signals and data signals to the gate lines G1 to Gn and the data lines D1 to Dm, respectively.

Figure 7A:
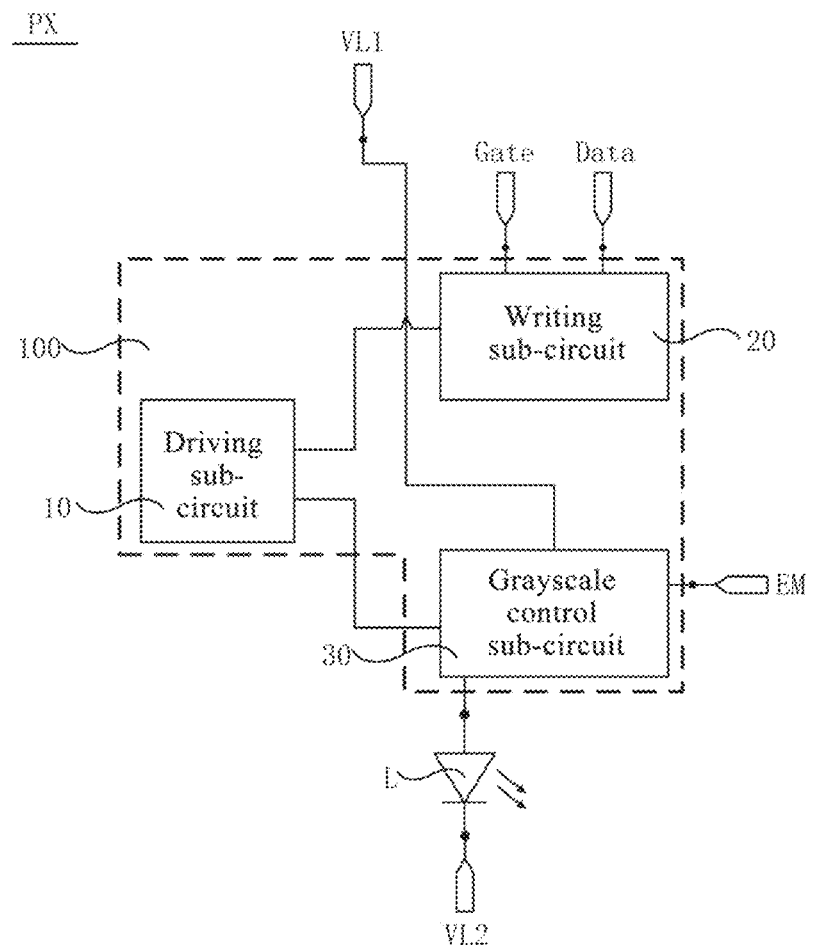
FIGS. 7A to 7C are a block diagram, a circuit diagram, and a timing diagram of a pixel in the display apparatus, respectively.
Figure 7B:
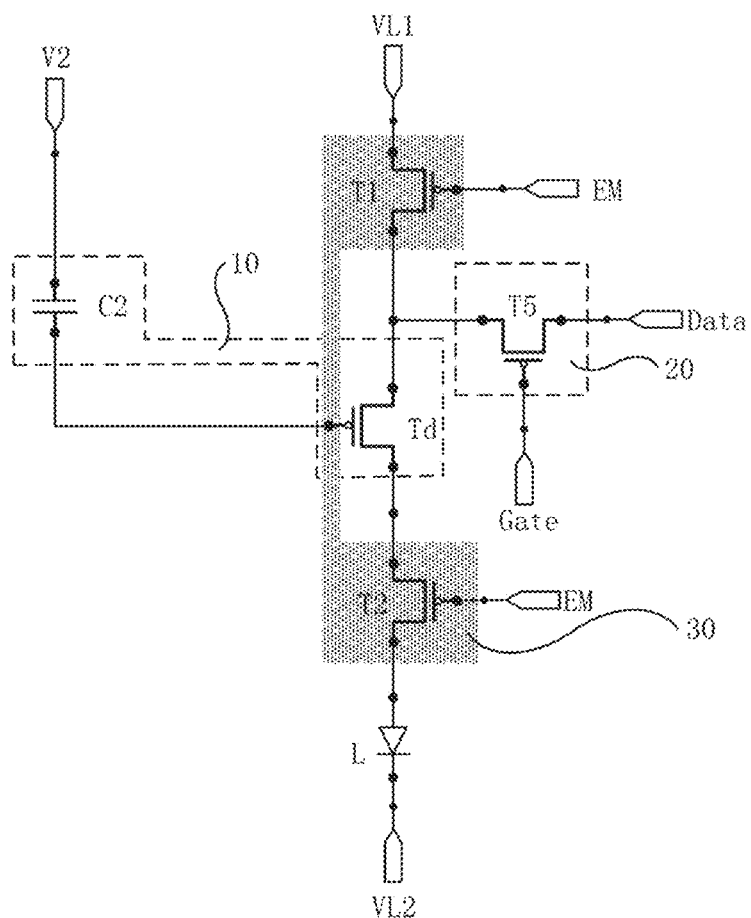
Figure 7C:
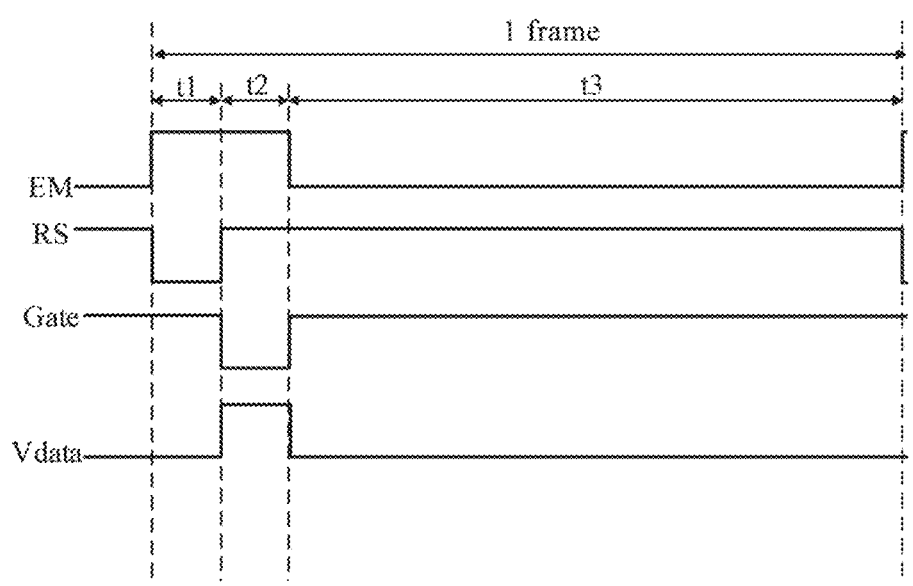

FIG. 7A is an exemplary block diagram of a pixel PX, FIG. 7B is an exemplary circuit diagram of the pixel PX, and FIG. 7C is a schematic timing diagram showing operation of the pixel PX. The pixel PX may include a pixel driving circuit 100 and a light-emitting device L. The pixel driving circuit 100 may include a driving sub-circuit 10, a writing sub-circuit 20, and a grayscale control sub-circuit 30. The pixel driving circuit 100 is connected to a scanning control terminal Gate connected to a gate line, a data signal terminal Data connected to a data line, and a light emission control terminal EM connected to a light emission control line. The light emission control driver according to the embodiments of the present disclosure may be used to provide a light emission control signal to the emission control terminal EM, and when such a light emission control signal is at an inactive level, the grayscale control sub-circuit 30 is turned on so that a light emission current may flow to the light-emitting device L. For example, where the pixel PX has an equivalent circuit as shown in FIG. 7B, the data driver applies a data signal supplied through a data line to a source of a transistor T5, and the gate driver applies a scanning signal supplied through a gate line to a gate of the transistor T5. The light emission control driver applies a light emission control signal supplied through a light emission control line to a gate of a transistor T2, so as to control a path through which the light emission current is transmitted to the light-emitting device L. A driving transistor Td provides a light emission current corresponding to the data signal. When the light emission control signal applied to the light emission control terminal EM is at a low level, the transistor T2 is turned on, and the light emission current flows to the light-emitting device L to make it emit light.

It should be noted that FIGS. 7A to 7C are merely examples of the pixel PX shown to help explain a control function of the light emission control signal supplied from the light emission control driver in the pixel PX, and the circuit structure and the operation process of the pixel PX are not limited thereto.

In some embodiments, the display apparatus according to the embodiments of the present disclosure may be a micro LED display apparatus.

For example, the display apparatus may be any product or component having a display function, such as a mobile phone, a tablet PC, a television, a monitor, a notebook computer, a digital album, a GPS or the like.

In another aspect, the present disclosure provides a driving method for the shift register described above. The method includes: applying, in a first time period, an input signal having an inactive level to the input signal terminal of the shift register, and providing a first clock signal having an active level and a second clock signal having an inactive level; applying, in a second time period, an input signal having an inactive level to the input signal terminal of the shift register, and providing a first clock signal having an inactive level and a second clock signal having an active level; applying, in a third time period, an input signal having an inactive level to the input signal terminal of the shift register, and providing a first clock signal having an active level and a second clock signal having an inactive level; applying, in a fourth time period, an input signal having an inactive level to the input signal terminal of the shift register, and providing a first clock signal having an inactive level and a second clock signal having an active level; applying, in a fifth time period, an input signal having an inactive level to the input signal terminal of the shift register, and providing a first clock signal having an active level and a second clock signal having an inactive level; applying, in a sixth time period, an input signal having an active level to the input signal terminal of the shift register, and providing a first clock signal having an inactive level and a second clock signal having an active level; applying, in a seventh time period, an input signal having an active level to the input signal terminal of the shift register, and providing a first clock signal having an active level and a second clock signal having an inactive level; and applying, in an eighth time period, an input signal having an active level to the input signal terminal of the shift register, and providing a first clock signal having an inactive level and a second clock signal having an active level. The first time period to the eighth time period are in a temporal sequence, and in a time period immediately preceding the first time period, the input signal has an active level. The first clock signal and the second clock signal have a same frequency and phases different from each other by 180°.

For example, referring to FIG. 3, the first to eighth time periods are the time periods T1 to T8 shown in FIG. 3, the first clock signal is the signal CK shown in FIG. 3, the second clock signal is the signal CKB shown in FIG. 3, the input signal is the signal INPUT shown in FIG. 3, and the signal output from the output terminal of the shift register is the signal OUT shown in FIG. 3.

For example, referring to the analysis above in conjunction with FIG. 3, at a start of the first time period T1, as the first clock signal changes from an inactive level to an active level, the voltage at the first node NODE1 changes from a second level to a first level, and at a start of the eighth time period T8, as the second clock signal changes from an inactive level to an active level, the voltage at the first node NODE1 changes from the second level to a higher third level.

For example, referring to the analysis above in conjunction with FIG. 3, at a start of the second time period T2, as the second clock signal changes from an inactive level to an active level, the voltage at the second node NODE2 changes from a fifth level to a higher sixth level, and at an end of the seventh time period T7, as the first clock signal changes from an active level to an inactive level, the voltage at the second node NODE2 changes from the fifth level to a fourth level.

According to the above driving method for a shift register of the present disclosure, duration of a time period, in which an output signal output from the output signal terminal OUT has an inactive level, may be controlled by setting duration of a time period, in which the input signal applied to the input signal terminal INPUT has an inactive level. Therefore, the number of control signals for the shift register can be reduced, and connection and wiring of the shift register are simplified.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A shift register, comprising:
    an input circuit connected to an input signal terminal, a first clock terminal, and a first node, and configured to receive an input signal applied to the input signal terminal and transmit, in response to a first clock signal applied to the first clock terminal, the input signal to the first node;
    a first control circuit connected to a second clock terminal, a first power terminal, the first node, and a second node, and configured to receive a first power signal applied to the first power terminal and control, in response to a second clock signal applied to the second clock terminal and a voltage at the second node, a voltage at the first node;
    a second control circuit connected to the first clock terminal, the second clock terminal, the first power terminal, a second power terminal, the first node, the second node, and a fifth node, and configured to receive the first power signal and a second power signal applied to the second power terminal, control, in response to the first clock signal, the second clock signal, and the voltage at the first node, a voltage at the second node, and control, in response to the second clock signal and the voltage at the first node, a voltage at the fifth node; and
    an output circuit connected to the first node, the fifth node, the first power terminal, the second power terminal, and an output signal terminal, and configured to transmit, in response to an active level at the first node, the second power signal to the output signal terminal, and transmit, in response to an active level at the fifth node, the first power signal to the output signal terminal, wherein duration of a time period in which an output signal output from the output signal terminal has an inactive level depends on duration of a time period in which the input signal applied to the input signal terminal has an inactive level, and
    all transistors comprised in the shift register are N-type transistors.

2. The shift register according to claim 1, wherein in response to the input signal having an inactive level and the first clock signal changing from an inactive level to an active level, the voltage at the first node changes from a second level to a first level, and in response to the input signal having an active level and the second clock signal changing from an inactive level to an active level, the voltage at the first node changes from the second level to a third level, wherein the first level is an inactive level, the second level and the third level are active levels, and the first level is lower than the second level, while the second level is lower than the third level.

3. The shift register according to claim 2, wherein in response to the input signal having an inactive level and the second clock signal changing from an inactive level to an active level, the voltage at the second node changes from a fifth level to a sixth level, and in response to the input signal having an active level and the first clock signal changing from an active level to an inactive level, the voltage at the second node changes from the fifth level to a fourth level, wherein the fourth level is an inactive level, the fifth level and the sixth level are active levels, and the fourth level is lower than the fifth level, while the fifth level is lower than the sixth level.

4. The shift register according to claim 1, wherein the first control circuit comprises: a first control transistor, a second control transistor and a first control capacitor,
    the first control transistor has a control electrode connected to the second clock terminal, a first electrode connected to the first node, and a second electrode connected to a third node, the second control transistor has a control electrode connected to the second node, a first electrode connected to the third node, a second electrode connected to the first power terminal, and the first control capacitor has a first terminal connected to the second clock terminal, and a second terminal connected to the first node.

5. The shift register according to claim 4, wherein the second control circuit comprises:
    a third control transistor, a fourth control transistor, a fifth control transistor, a sixth control transistor and a second control capacitor,
    the third control transistor has a control electrode connected to the first node, a first electrode connected to the first clock terminal, and a second electrode connected to the second node, the fourth control transistor has a control electrode connected to the first clock terminal, a first electrode connected to the second power terminal, and a second electrode connected to the second node, the fifth control transistor has a control electrode connected to the second node, a first electrode connected to the second clock terminal, and a second electrode connected to a fourth node, the sixth control transistor has a control electrode connected to the second clock terminal, a first electrode connected to the fourth node, and a second electrode connected to the fifth node, and the second control capacitor has a first terminal connected to the second node, and a second terminal connected to the fourth node.

6. The shift register according to claim 5, wherein the second control circuit further comprises: a seventh control transistor and a third control capacitor, the seventh control transistor has a control electrode connected to the first node, a first electrode connected to the fifth node, a second electrode connected to the first power terminal, and the third control capacitor has a first terminal connected to the fifth node, and a second terminal connected to the first power terminal.

7. The shift register according to claim 6, wherein the output circuit comprises: a first output transistor and a second output transistor, the first output transistor has a control electrode connected to the first node, a first electrode connected to the second power terminal, and a second electrode connected to the output signal terminal, and the second output transistor has a control electrode connected to the fifth node, a first electrode connected to the output signal terminal, and a second electrode connected to the first power terminal.

8. The shift register according to claim 7, wherein the input circuit comprises: a first input transistor having a control electrode connected to the first clock terminal, a first electrode connected to the input signal terminal, and a second electrode connected to the first node.

9. The shift register according to claim 5, wherein the output circuit comprises: a first output transistor and a second output transistor, the first output transistor has a control electrode connected to the first node, a first electrode connected to the second power terminal, and a second electrode connected to the output signal terminal, and the second output transistor has a control electrode connected to the fifth node, a first electrode connected to the output signal terminal, and a second electrode connected to the first power terminal.

10. The shift register according to claim 9, wherein the input circuit comprises: a first input transistor having a control electrode connected to the first clock terminal, a first electrode connected to the input signal terminal, and a second electrode connected to the first node.

11. The shift register according to claim 1, wherein all transistors comprised in the shift register are oxide thin film transistors.

12. A light emission control driver, comprising multiple stages of shift registers, each shift register being the shift register according to claim 1.

13. The light emission control driver according to claim 12, wherein the first clock terminal of a shift register at an odd-numbered stage in the multiple stages of shift registers is connected to a first clock signal line, while the second clock terminal of the shift register at an odd-numbered stage is connected to a second clock signal line, and the first clock terminal of a shift register at an even-numbered stage in the multiple stages of shift registers is connected to the second clock signal line, while the second clock terminal of the shift register at an even-numbered stage is connected to the first clock signal line, and a clock signal applied to the first clock signal line and a clock signal applied to the second clock signal line have a same frequency and phases different from each other by 180°.

14. The light emission control driver according to claim 13, wherein an emission start signal is applied to the input signal terminal of a shift register at a first stage in the multiple stages of shift registers, and the input signal terminal of a shift register at each stage except for the first stage in the multiple stages of shift registers is connected to the output signal terminal of a shift register at a previous stage.

15. A display apparatus, comprising:

a plurality of pixels each connected to a corresponding one of a plurality of gate lines, a corresponding one of a plurality of data lines, and a corresponding one of a plurality of light emission control lines; and the light emission control driver according to claim 14, wherein the output signal terminal of a shift register at each stage in the light emission control driver is connected to a corresponding one of the plurality of light emission control lines to transmit an output signal from the shift register at this stage to the corresponding one of the plurality of light emission control lines.

16. A display apparatus, comprising:

a plurality of pixels each connected to a corresponding one of a plurality of gate lines, a corresponding one of a plurality of data lines, and a corresponding one of a plurality of light emission control lines; and the light emission control driver according to claim 13, wherein the output signal terminal of a shift register at each stage in the light emission control driver is connected to a corresponding one of the plurality of light emission control lines to transmit an output signal from the shift register at this stage to the corresponding one of the plurality of light emission control lines.

17. A display apparatus, comprising:

a plurality of pixels each connected to a corresponding one of a plurality of gate lines, a corresponding one of a plurality of data lines, and a corresponding one of a plurality of light emission control lines; and the light emission control driver according to claim 12, wherein the output signal terminal of a shift register at each stage in the light emission control driver is connected to a corresponding one of the plurality of light emission control lines to transmit an output signal from the shift register at this stage to the corresponding one of the plurality of light emission control lines.

18. A driving method for a shift register, wherein the shift register is the shift register according to claim 1, the first clock signal and the second clock signal have a same frequency and phases different from each other by 180°, and the driving method comprises:

applying, in a first time period, an input signal having an inactive level to the input signal terminal of the shift register, and providing a first clock signal having an active level and a second clock signal having an inactive level;

applying, in a second time period, an input signal having an inactive level to the input signal terminal of the shift register, and providing a first clock signal having an inactive level and a second clock signal having an active level;

applying, in a third time period, an input signal having an inactive level to the input signal terminal of the shift register, and providing a first clock signal having an active level and a second clock signal having an inactive level;

applying, in a fourth time period, an input signal having an inactive level to the input signal terminal of the shift register, and providing a first clock signal having an inactive level and a second clock signal having an active level;

applying, in a fifth time period, an input signal having an inactive level to the input signal terminal of the shift register, and providing a first clock signal having an active level and a second clock signal having an inactive level;

applying, in a sixth time period, an input signal having an active level to the input signal terminal of the shift register, and providing a first clock signal having an inactive level and a second clock signal having an active level;

applying, in a seventh time period, an input signal having an active level to the input signal terminal of the shift register, and providing a first clock signal having an active level and a second clock signal having an inactive level; and applying, in an eighth time period, an input signal having an active level to the input signal terminal of the shift register, and providing a first clock signal having an inactive level and a second clock signal having an active level, wherein the first time period to the eighth time period are in a temporal sequence, and in a time period immediately preceding the first time period, the input signal has an active level.

19. The driving method according to claim 18, wherein at a start of the first time period, as the first clock signal changes from an inactive level to an active level, the voltage at the first node changes from a second level to a first level, and at a start of the eighth time period, as the second clock signal changes from an inactive level to an active level, the voltage at the first node changes from the second level to a third level, wherein the first level is an inactive level, the second level and the third level are active levels, and the first level is lower than the second level, while the second level is lower than the third level.

20. The driving method according to claim 19, wherein at a start of the second time period, as the second clock signal changes from an inactive level to an active level, the voltage at the second node changes from a fifth level to a sixth level, and at an end of the seventh time period, as the first clock signal changes from an active level to an inactive level, the voltage at the second node changes from the fifth level to a fourth level, wherein the fourth level is an inactive level, the fifth level and the sixth level are active levels, and the fourth level is lower than the fifth level, while the fifth level is lower than the sixth level.

\* \* \* \* \*